United States Patent
Wechsler et al.

(10) Patent No.: US 9,178,329 B2
(45) Date of Patent: Nov. 3, 2015

(54) LASER DESIGN

(76) Inventors: Barry A. Wechsler, Kinnelon, NJ (US); Michael P. Scripsick, Lafayette, NJ (US); David S. Sumida, Marina del Rey, CA (US); Thomas G. Crow, Las Cruces, NM (US)

( * ) Notice: Subject to any disclaimer, the term of this patent is extended or adjusted under 35 U.S.C. 154(b) by 458 days.

(21) Appl. No.: 13/470,081

(22) Filed: May 11, 2012

(65) Prior Publication Data

US 2015/0103855 A1 Apr. 16, 2015

Related U.S. Application Data

(60) Provisional application No. 61/485,052, filed on May 11, 2011.

(51) Int. Cl.
| | |
|---|---|
| *H01S 3/04* | (2006.01) |
| *H01S 3/06* | (2006.01) |
| *C30B 19/12* | (2006.01) |
| *C30B 29/32* | (2006.01) |
| *H01S 3/094* | (2006.01) |
| *H01S 3/0941* | (2006.01) |
| *H01S 3/16* | (2006.01) |

(52) U.S. Cl.
CPC .............. *H01S 3/0602* (2013.01); *C30B 19/12* (2013.01); *C30B 29/32* (2013.01); *H01S 3/0408* (2013.01); *H01S 3/0612* (2013.01); *H01S 3/1675* (2013.01); *H01S 3/0604* (2013.01); *H01S 3/0941* (2013.01); *H01S 3/09408* (2013.01); *H01S 3/094084* (2013.01); *H01S 3/1618* (2013.01)

(58) Field of Classification Search
CPC .............................. H01S 3/0408; H01S 3/1675
See application file for complete search history.

(56) References Cited

U.S. PATENT DOCUMENTS

| | | | |
|---|---|---|---|
| 5,337,401 A | 8/1994 | Onishi et al. | |
| 5,553,088 A * | 9/1996 | Brauch et al. | 372/34 |
| 6,370,172 B1 * | 4/2002 | Bowman | 372/34 |
| 7,085,304 B2 * | 8/2006 | Vetrovec | 372/107 |
| 2002/0039377 A1 * | 4/2002 | Zapata et al. | 372/70 |
| 2003/0161375 A1 * | 8/2003 | Filgas et al. | 372/66 |
| 2005/0036531 A1 * | 2/2005 | Kan et al. | 372/70 |
| 2005/0254540 A1 * | 11/2005 | Nettleton et al. | 372/71 |
| 2006/0233209 A1 * | 10/2006 | Kirilov | 372/39 |

(Continued)

OTHER PUBLICATIONS

Aznar, A., et al., "Growth, Optical Characterization, and Laser Operation of Epitaxial Yb:KY(WO$_4$)$_2$/KY9WO$_4$)$_2$ Composites With Monoclinic Structure," *Applied Physics Letters*, vol. 85, No. 19, Nov. 2004, pp. 4313-4315.

(Continued)

*Primary Examiner* — Joshua King
(74) *Attorney, Agent, or Firm* — Haynes & Boone, LLP

(57) ABSTRACT

A laser gain element including an undoped layer of a monoclinic double tungstate (MDT) crystal, and a method of forming a laser gain element are provided. The laser gain element includes a layer of doped MDT crystal adjacent to the undoped layer, the doped MDT layer including a pre-selected concentration of rare earth ions. The layer of doped MDT crystal has an absorption peak at a first wavelength and an emission peak at a second wavelength longer than the first wavelength; and the layer of doped MDT crystal has a fluorescence emission with a weighted average at a third wavelength shorter than the first wavelength. A laser resonator cavity formed with a plurality of composite gain elements as above is also provided.

8 Claims, 8 Drawing Sheets

(56) References Cited

U.S. PATENT DOCUMENTS

2010/0215067 A1* 8/2010 Ripin et al. ............... 372/29.02
2011/0104491 A1* 5/2011 Shaw et al. ................ 428/372

OTHER PUBLICATIONS

Aznar, A., et al., "Liquid-Phase Epitaxy Crystal Growth of Monoclinic," *Crystal Growth & Design*, vol. 6, No. 8, 2006, pp. 1781-1787.

Bowman, Steven R., et al, "Ytterbium Laser With Reduced Thermal Loading," *IEEE Journal of Quantum Electronics*, vol. 41, No. 12, Dec. 2005, pp. 1510-1517.

Mungan, C.E., et al., "Solid-State Laser Cooling of Ytterbium-Doped Tungstate Crystals," *Lasers 2000*, 8 pages.

International Preliminary Report on Patentability and the Written Opinion mailed Nov. 21, 2013, in related International Application No. PCT/US2012/037632.

PCT International Search Report and Written Opinion mailed Jan. 24, 2013, in related International Application No. PCT/US2012/037632.

Romanyuk et al., "Yb-doped K(WO4)2 planar waveguide laser", Optics Letters [online], [Retrieved on Dec. 19, 2012], <URL: http://www.opticsinfobase.org/ol/abstract.cfm?uri=ol-31-1-53>, Abstract, p. 53, para 1, Jan. 3-5, 2006.

Rivier et al., "Diffusion Bonding of Monoclinic Yb:KY(WO4)2/KY(WO4)2 and its Continuous-Wave Laser Operation", OSA/ASSP (2008).

Ferré, "Crystal growth, optical characterisation and laser operation of Yb3+ in monoclinic double tungstates", thesis dissertation, Física i Cristal•lografia de Materials (FiCMA), Departament de Química Física i Inorgànica, Universitat Rovira i Virgili, Campus Sescelades, Av. Països Catalans, n° 26, 43007 Tarragona, Spain, 2004.

* cited by examiner

LASER DESIGN

CROSS-REFERENCE TO RELATED APPLICATIONS

This application relates and claims priority to U.S. Provisional Patent Application No. 61/485,052 filed May 11, 2011 entitled "Laser Design," the disclosure of which is incorporated by reference in its entirety here for all purposes.

STATEMENT REGARDING FEDERALLY SPONSORED RESEARCH OR DEVELOPMENT

All or a portion of this invention was made with Government support under US Air Force Contract #FA8650-05-D-5807, SubContract #10-S568-0093-01-C1, US Army Contract #W15QKN-09-C-009, and Missile Defense Agency Contract #HQ0147-11-C-7530. The US Government may have certain rights in the invention.

BACKGROUND

1. Technical Field

Embodiments disclosed herein are directed to a laser design.

2. Description of Related Art

Lasers are utilized in many aspects of manufacturing, communications, consumer electronics, information technology, scientific investigation, medicine, law enforcement, entertainment, and the military. Typically, high power laser applications involve high thermal stress in lasing materials due to inefficient pump energy conversion. Therefore, there is a need for improved laser systems having improved thermal characteristics.

SUMMARY

In accordance with some embodiments, a laser gain element may include an undoped layer of a monoclinic double tungstate (MDT) crystal; a layer of doped MDT crystal adjacent to the undoped layer, the doped MDT layer including a pre-selected concentration of rare earth ions, wherein: the layer of doped MDT crystal has an absorption peak at a first wavelength and an emission peak at a second wavelength longer than the first wavelength; and the layer of doped MDT crystal has a fluorescence emission with a weighted average at a third wavelength shorter than the first wavelength.

A laser resonator cavity formed with a plurality of composite gain elements, each of the plurality of composite gain elements including an undoped region of a monoclinic double tungstate (MDT) crystal; and a doped region of MDT crystal, wherein: the doped region comprises a concentration of a rare earth doping.

A method of forming a laser gain element according to some embodiments may include forming a composite crystal by forming a doped region adjacent to an undoped region in a monoclinic double tungstate (MDT) crystal; forming the composite crystal into a shape having a thickness; polishing the surfaces of the composite crystal shape; and coating the surfaces of the composite crystal.

These and other embodiments are further described below.

DETAILED DESCRIPTION

Figures 1A, 1B, 1C:
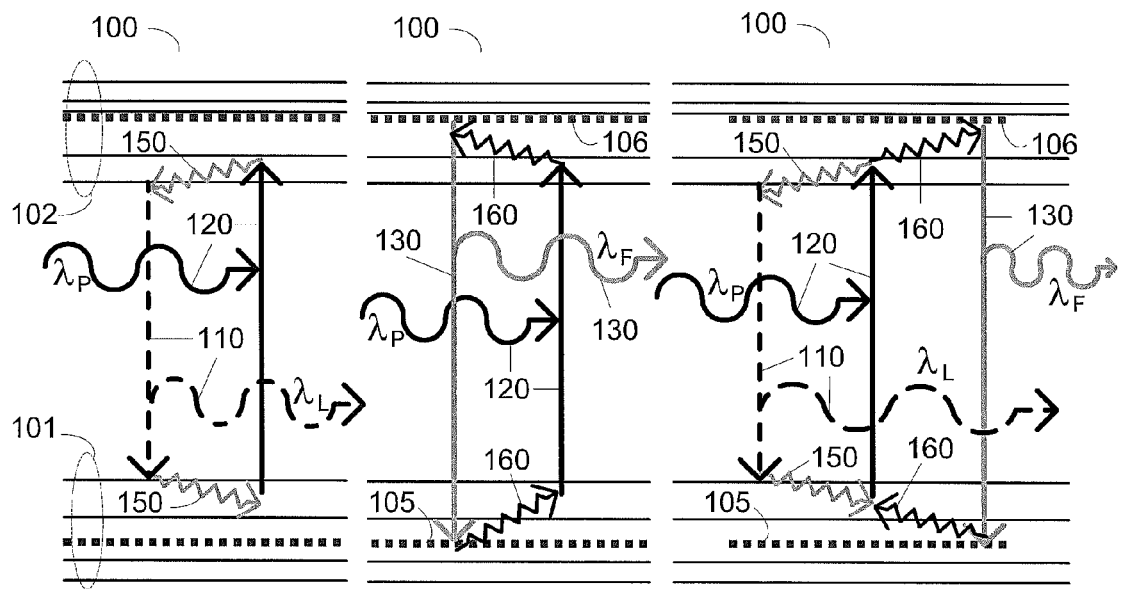
FIG. 1A illustrates the energy level diagram for small quantum defect lasing, according to some embodiments.
FIG. 1B illustrates the energy level diagram for anti-Stokes fluorescence cooling, according to some embodiments.
FIG. 1C illustrates the energy level diagram for radiation balanced lasing (RBL), according to some embodiments.

Embodiments disclosed herein include a laser gain element scalable to operate at power levels in the 10s to 100s of kilo-Watts (kW). According to some embodiments, the laser is packaged in a light-weight, compact, and rugged design while maintaining high efficiency, high brightness, and good beam quality. Some embodiments provide a high average power laser while overcoming the thermo-optic and thermo-mechanical effects inherent in the lasing process. The inherent heating results from the difference in the energy of the pump photons (higher energy) and the lasing photons (lower energy). The difference in energy (the quantum defect) is generally converted to heat in the laser gain medium which can lead to beam distortions due to temperature dependent changes in the refractive indices (thermal lensing). In more severe cases, the temperature gradients inside the gain medium can be so intense as to lead to catastrophic failure (thermal fracture). In very high power laser systems, management of the thermal load becomes a primary design consideration which often leads to added complexity. One of the proven methods of thermal management is to use thin disk gain elements. Heavily doped thin disk gain media have advantages over rod gain media in that they can be actively cooled with a heat sink on one of the disk faces. The extraction of heat from a thin disk is more efficient as the thermal contact area is large compared to the laser gain volume. In addition, the temperature gradients are primarily longitudinal to the output beam minimizing the thermal lens. However, traditional face pumping of the thin disk YAG gain medium presents challenges in pumping as the low absorption coefficient typically requires greater than 16 passes of the pump beam for high pump efficiency necessitating the addition of a series of imaging pump optics. Alternatively, side pumping of the thin disk is problematic due to the thin profile and the difficulty in obtaining uniform transverse pump distribution, resulting in lower optical efficiency and beam quality.

While the above described material properties and gain element configuration can mitigate the deleterious thermal effects in high average power lasing, extremely high powers require additional novel design concepts. A particularly innovative approach called "radiation balanced lasing" (RBL) has been proposed in recent years to facilitate very high power lasers. Radiation balanced lasing is described in detail in the paper by C. E. Mungan, S. R. Bowman, T. R. Gosnell, Laser 2000, edited by V J J Corcoran, and T. A. Corcoran, "Solid-state laser cooling of ytterbium-doped tungstate crystals," STS Press, Laser 2000, McLean V A, p. 819 (2001); edited by V J J Corcoran, and T. A. Corcoran. As described in the above paper, mitigating heat generation in the laser process leads to a reduction of thermal effects in the lasing material and packaging. Thus, in some embodiments it is desirable that the pump photon energy should be as low as possible and the laser photon energy should be as high as possible. This ultimately implies selection of a laser gain medium with low quantum defect $(1-\lambda_P/\lambda_L)$, where $\lambda_P$ is the wavelength of the pump laser, and $\lambda_L$ is the wavelength of the desired laser, or laser wavelength. The RBL approach begins by shifting the pump wavelength from the peak of the optical absorption spectrum (most commonly employed for high absorption efficiency) to the longer wavelength wing (lower energy) of the absorption spectrum. In this manner, the quantum defect can be reduced to approximately the Boltzmann limit of $kT/h\nu_L$; where k is Boltzmann's constant (k~$8.617\times10^{-5}$ eV/K), T is the absolute temperature (Kelvin), h is Planck's constant (h=$6.626\times10^{-34}$ J s), and $\nu_L$ is the frequency of the electromagnetic radiation at the laser wavelength.

FIGS. 1A, 1B, and 1C show bands 101 and 102 of energy levels in an optical system 100, according to some embodiments. For example, the optical system 100 may include a crystal doped with a rare earth ion. In some embodiments, the dopant may be Ytterbium (Yb). More particularly, the dopant may be the ion $Yb^{3+}$. Bands 101 and 102 may represent electronic states of the ion such that a transition between states from excited band 102 to ground state band 101 result in photon emission. A photon absorption process may induce the system to transition from ground state band 101 to excited state band 102. Note that each band 101 and 102 may include a plurality of closely spaced energy levels. For example, the energy levels within ground state band 101 or within excited state band 102 may be separated by an energy difference less than a thermal energy $(E_T)$ given by $E_T=kT$. A thermal energy $E_T$ is typically given at temperatures close to room temperature from approximately 280K to approximately 320 K.

FIGS. 1A, 1B, and 1C illustrate a transition 120 from band 101 to band 102. Transition 120 represents absorption of pump energy provided by a pump photon. FIGS. 1A, 1B, and 1C also illustrate a transition 110 from band 102 to band 101. Transition 110 represents stimulated emission and lasing. FIGS. 1B and 1C illustrate a transition 130 from band 102 to band 101. Transition 130 represents spontaneous emission from the optical system. Transition 130 may occur between a plurality of energy levels in band 102 and a plurality of energy levels in band 101, forming a spontaneous emission spectrum for the system. Thus, transition 130 from virtual level 106 in the excited state band to virtual level 105 in the ground state band represents a weighted average of all excited state to ground state transitions in the spontaneous emission spectrum. FIGS. 1A and 1C illustrate intra-band transitions 150. Intra-band transitions 150 represent nonradiative decay between energy levels included within each of bands 101 and 102. Transition 150 is a decay from a higher energy level to a lower energy level without emission of a photon. Typically, the energy released in decay 150 heats the medium, for example by emission of a phonon to the crystal where the Yb ion is embedded. FIGS. 1B and 1C illustrate intra-band transitions 160. Intra-band transitions 160 represent excitation from a lower energy level to a higher energy level without absorption of a photon. Typically, the energy absorbed in transition 160 cools the medium. For example, in some embodiments transition 160 represents phonon absorption from the crystal lattice where an Yb ion is embedded. The balance between a heating transition 150 and a cooling transition 160 results in a net thermal load for the optical system.

Referring in more detail to FIG. 1A, the energy level diagram for a small quantum defect lasing is illustrated, according to some embodiments. The quantum defect may be associated with the energy difference between transition 120 (pump absorption) and transition 110 (stimulated emission). The lower limit to the quantum defect is approximately 2% for 1 µm lasers. The result is a net positive thermal load induced by transition 150 in the excited state band 102, and transition 150 in the ground state band 101. The net positive thermal load can be reduced from the Boltzmann limit by optical cooling via anti-Stokes spontaneous emission. If the mean spontaneous emission has higher energy than the pump energy then spontaneous emission acts to cool the fluorescence medium. In some embodiments the fluorescence medium may be a crystal doped with an absorbing ion. In some embodiments an absorbing ion may be $Yb^{3+}$. This is the principle of optical cooling, as illustrated in relation to FIG. 1B.

FIG. 1B illustrates the energy level diagram for anti-Stokes fluorescence cooling, according to some embodiments. In FIG. 1B, a pump photon is absorbed in transition 120, which together with a first phonon absorption 160 promotes the optical system from band 101 to band 102. Spontaneous emission 130 follows, after a second phonon absorption 160. By changing the average rates of stimulated emission 110 (FIG. 1A) and spontaneous emission 130 the net thermal load may be reduced to zero or nearly zero. The thermal load results from the net addition of transitions 150 and transitions 160. This corresponds to radiation balanced lasing, as illustrated in detail below, in relation to FIG. 1C.

FIG. 1C illustrates the energy level diagram for radiation balanced lasing, according to some embodiments. The monoclinic double tungstate (MDT) family of crystals, which includes $KGd(WO_4)_2$, $KY(WO_4)_2$, and $KLu(WO_4)_2$ (KGW, KYW and KLW, respectively) are uniquely suited to satisfy the requirements for RBL as depicted in FIG. 1C above. KGW and KYW are among the very few materials for which anti-Stokes fluorescence cooling has been demonstrated. Bowman et al. used a 2 mm thick×8 mm diameter Yb:KGW thin disk in a radially pumped configuration to generate nearly 500 W of quasi-continuous laser radiation with 45% conversion efficiency of absorbed pump power with only 3% of the pump energy being converted to heat (cf. Steven R. Bowman, Shawn P. O'Connor, and Subrat Biswal, Ytterbium Laser With Reduced Thermal Loading, IEEE Journal of Quantum Electronics 41, no. 12, 1510 (2005)). For this demonstration the edges of the disk were not polished or AR coated so coupling of the pump power was poor (49%). Beam quality was also poor ($M^2$=170) due to the non uniform transverse pump distribution. Beam quality was dramatically improved at the expense of power by changing the mirror curvatures and adjusting the cavity length (309 W with $M^2$=2.7) and further improved with the addition of an intra-cavity aperture (177 W with $M^2$=1.2). The authors noted that the prototype design was not fully optimized as the disk profile was too small to intercept the diode pump light completely, the disk edge was unpolished with no AR coating further adding to pump losses, and much of the diode light was absorbed outside the useful mode volume thus impacting laser efficiency and beam quality.

Appropriate design of composite MDT gain elements overcomes pumping limitations in Yb lasing with reduced thermal loading. In some embodiments a gain element may use an Yb doped MDT crystal either diffusion bonded or epitaxially grown onto an undoped MDT substrate. According to some embodiments, the undoped section in a composite MDT gain element allows for normal incident entry from a side facet, resulting in grazing incidence pumping of the doped gain section without high reflection loss. This will be described in more detail below, with reference to FIG. 2A.

Figure 2A:
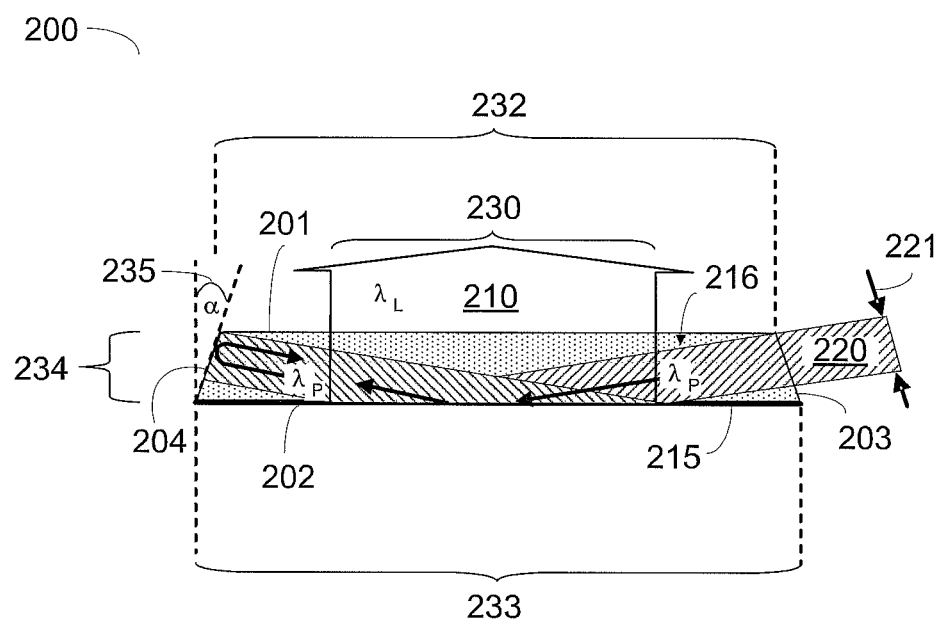
FIG. 2A illustrates a side view of a composite gain element, according to some embodiments.

FIG. 2A illustrates a side view of a composite gain element 200. The relative positioning, form and shape of the different elements illustrated in FIG. 2A is not limiting. One of ordinary skill would realize that an element that is shown on top of another element in FIG. 2A may be placed adjacent to one another in a different configuration, obtaining the same or similar result. According to some embodiments, composite gain element 200 is formed of a doped region 215 adjacent to an undoped region 216. Undoped region 216 may be a crystal such as any of the crystals from the MDT family of crystals. Doped region 215 may include the same crystal material used in undoped region 216, doped with an absorbing element, such as rare earth ion. In some embodiments, doped region 215 may include $Yb^{3+}$ ions as dopant in a crystal from the MDT family of crystals. Doped region 215 in composite gain element 200 is the active gain region. The doping ion is promoted to an excited state upon absorption of radiation at the pump wavelength $\lambda_P$. The doping ion thus excited generates stimulated emission at the laser wavelength $\lambda_L$ upon decay from the excited state.

Composite gain element 200 may include a top face 201, a bottom face 202, and at least a pump facet 203 and a back facet 204 opposite to pump facet 203. In some embodiments, pump facet 203 and back facet 204 are formed at an angle ($\alpha$) 235 relative to the normal to bottom face 202. Angle 235 formed by pump facet 203 and back facet 204 creates a first diameter (d1) 233 in bottom face 202, and a second diameter (d2) 232 in top face 201. In some embodiments, top face 201 may be parallel to bottom face 202, forming a composite crystal with a thickness (t) 234.

In some embodiments an anti-reflection (AR) coating layer at the laser wavelength, $\lambda_L$, may be formed on top face 201. In some embodiments, bottom face 202 may be uncoated. Some embodiments may include a high-reflectivity (HR) coating at laser wavelength $\lambda_L$ on bottom face 202. In some embodiments, an AR coating layer at pump wavelength $\lambda_P$ may be formed on pump facet 203 and an HR coating layer at pump wavelength $\lambda_P$ may be formed on back facet 204. FIG. 2A illustrates pump radiation width 221 at pump wavelength $\lambda_P$ forming pump beam 220, and entering gain element 200 through pump facet 203. Pump beam 221 goes through doped region 215 for a first time and is reflected off of bottom surface 202, passing through doped region 215 for a second time. Pump beam 221 may be reflected off of facet 204 so that the pump beam passes through doped region 215 for a third and a fourth time. As pump beam 221 passes through doped region 215 four times, it excites the dopant and induces the generation of laser radiation 210 at laser wavelength $\lambda_L$. According to some embodiments, laser radiation 210 may be generated in a direction perpendicular or almost perpendicular to bottom face 202, having a laser width (w) 230. In some embodiments, laser width 230 may be the diameter of a spot formed by pump beam 221 on doped region 215 as it impinges on bottom surface 202 at a grazing angle.

According to some embodiments, the angle of incidence of pump beam 221 upon doped region 215 is governed by angle $\alpha$ 235. Furthermore, laser width 230 is determined by the angle of incidence of pump beam 221 upon doped region 215. While FIG. 2A shows laser radiation 210 emitted in a direction perpendicular to bottom face 202, this configuration is not limiting. One of ordinary skill would realize that gain element 200 may be placed inside a laser cavity or resonator. Thus, stimulated radiation 210 at the laser wavelength $\lambda_L$ may be generated at any angle relative to top surface 201 or bottom surface 202.

Table 1 illustrates the dimensions of a gain element 200 according to some embodiments. The dimensions given in Table 1 are exemplary only and not limiting. According to the dimensions in Table 1, an output beam 210 may have width 230 of 12-15 mm with pump and back facets 203 and 204 oriented at an angle $\alpha$ of about 10°-15°. According to some embodiments, doped region 215 may be bonded to undoped region 216. In some embodiments, doped region may be epitaxially grown on top of undoped region 216. In some embodiments, doped region 215 may be much thinner than undoped region 216. For example, in some embodiments doped region 215 may be about 200 μm thick and the total thickness 234 of composite gain element 200 may be about 3-5 mm. In some embodiments, doped region 215 may have a thickness which is about $1/10^{th}$ or less of a fraction of the total thickness 234 of the composite gain element 200.

TABLE 1

Dimensions of composite gain module shown for output beam of 12-15 mm diameter and pump facets oriented at 10°-15°.

| | | | | |
|---|---|---|---|---|
| Output Beam Diameter (w) | 12 | 12 | 15 | 15 |
| Angle of pump facet ($\alpha$) | 15 | 10 | 15 | 10 |
| Wafer thickness (t) | 4.4 | 2.9 | 5.5 | 3.6 |
| Width of top face from facet-to-facet ($d_1$) | 20.8 | 20.8 | 26 | 26 |
| Width of top face from facet-to-facet ($d_1$) | 24 | 24 | 30 | 30 |
| Width of top face from facet-to-facet ($d_1$) | 23.1 | 21.8 | 28.9 | 27.3 |
| Width of top face from facet-to-facet ($d_1$) | 26.7 | 25.2 | 33.4 | 31.5 |
| Long axis of pump beam (pl) | 12 | 12 | 15 | 15 |
| Long axis of pump beam (ps) | 3.1 | 2.1 | 3.9 | 2.6 |
| Aspect ratio of pump beam | 3.9 | 5.8 | 3.9 | 5.8 |

Figure 2B:
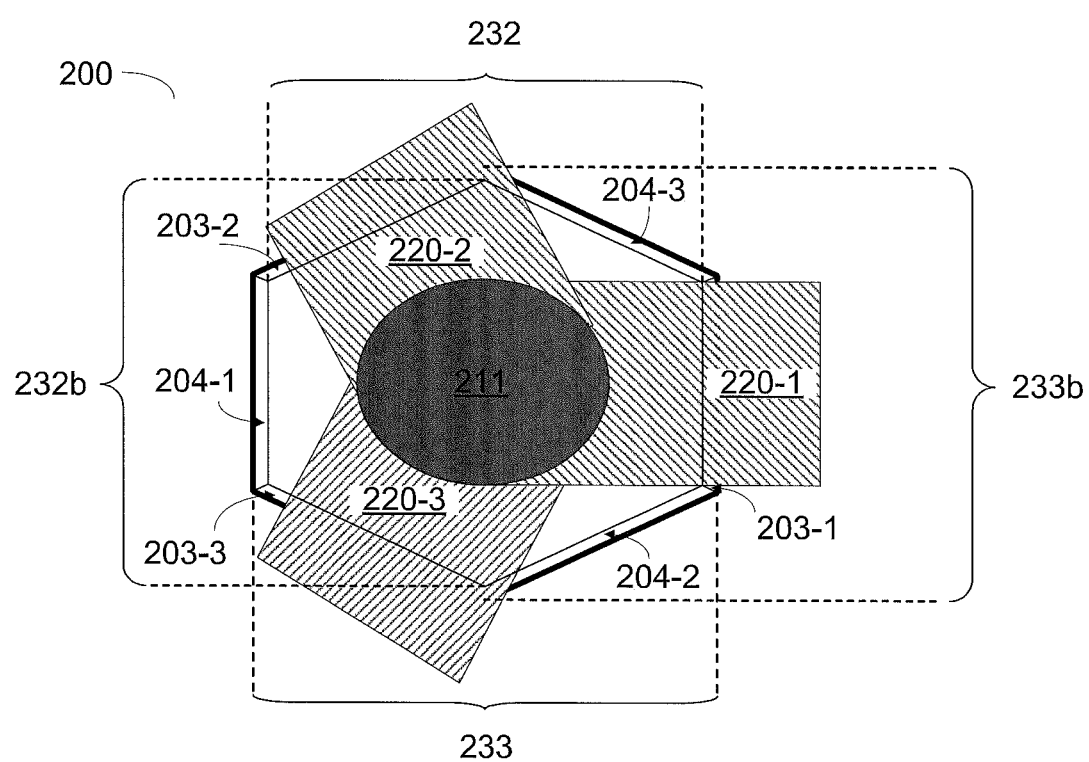
FIG. 2B illustrates a plan view of a composite gain element, according to some embodiments.

FIG. 2B illustrates a plan view of a composite gain element 200, according to some embodiments. Six edges symmetrically distributed about the diameter of the wafer are ground and polished at angle $\alpha$ 235 relative to the normal of bottom surface 202 (cf. FIG. 2A). The edges allow for three different pump beams 220-1, 220-2, and 220-3 (collectively referred to as pump beams 220) to impinge on doped region 215 of gain element 200. For example, pump beam 220-1 enters gain element 200 through pump facet 203-1 and is reflected in back facet 204-1. Likewise, pump beam 220-2 enters gain element 200 through pump facet 203-2 and is reflected in back facet 204-2. Similarly, pump beam 220-3 may enter gain element 200 through pump facet 203-3 and be reflected in back facet 204-3. According to some embodiments, gain element 200 may form a hexagonal shape having a first diameter 232 in a first direction, and a second diameter 232b in a second direction. The first direction and the second direction may be substantially orthogonal to one another.

An elliptical pump beam 220-1, 220-2, or 220-3 may enter gain element 200 normal to one of the edge facets 203-1, 203-2, or 203-3. Inside gain element 200, pump beams 220 strike doped region 215 in the center of gain element 200. Pump beams 220 thus form emitting portion 211 having a near uniform pump distribution across a 12-15 mm cross section, according to some embodiments. Emitting portion 211 in doped region 215 of gain element 200 produces the stimulated radiation forming laser light 210. According to some embodiments, laser light 210 is emitted perpendicularly or almost perpendicularly to the plane of FIG. 2B. There is no reflection loss at the interface of doped region 215 and undoped region 216, as the indices of refraction are essentially identical. As a result, a large portion of the pump light enters the doped layer. After being partially absorbed in the doped layer, the pump beam is reflected off the bottom face to make a second pass through the doped region. The pump beam then re-enters the undoped section and is back-reflected at the back facet in the opposite side. The pump beam returns to the center of the gain element for a third and fourth pass through the doped region before exiting the wafer through the original entry facet.

In some embodiments, pump beams 220 are commercial off-the shelf (COTS) diode lasers having $\lambda_P$=980 nm. In some embodiments, a 50% effective absorption cross section may be obtained for pump lasers 220 relative to the peak absorption cross section ($1.2 \times 10^{-20}$ cm$^2$ at 981 nm) of doped region 215. The effective absorption of pump lasers 220 is determined by a spectral overlap of $\lambda_P$ with the absorption spectrum of doped region 215. In some embodiments gain element 200 as depicted in FIG. 2A includes a Yb dopant concentration of 10%, achieving up to 95% pump absorption for a 200 μm thick doped region 215, at $\lambda_P$=980 nm.

In addition to high pump absorption, embodiments of gain element 200 include pump facets 203-1, 203-2, and 203-3 having AR coating at $\lambda_P$ for pump entry at normal incidence. In some embodiments, gain element 200 includes back facets 204-1, 204-2, and 204-3 having a HR coating at $\lambda_P$ for pump reflection at normal incidence. Thus, some embodiments of gain element 200 may eliminate the need for complicated coatings required to deal with different reflectivities for both the pump wavelength $\lambda_P$, and the laser wavelength $\lambda_L$. This is convenient for embodiments using RBL schemes (cf. FIG. 1C), as $\lambda_P$ and $\lambda_L$ may be close to one another (<50 nm) to reduce the quantum defect. According to some embodiments, gain element 200 has an hexagonal shape allowing three pump beams 220 to intersect the same doped region 215 with near uniform illumination. A residual non-uniformity of a specific pump beam such as 220-1, may be averaged out to a degree by the other two pump beams 220-2, and 220-3.

A gain element 200 as in some embodiments is neither face pumped nor edge pumped in the traditional sense. In some embodiments, gain element 200 is pumped in a manner resembling edge pumping configurations. In some embodiments effective pumping of doped region 215 resembles face pumping configurations. Accordingly, in some embodiments the pumping configuration may be a "quasi-face pumping." Quasi-face pumping eliminates the non-uniform pump distribution that is problematic in edge pumped thin disks while eliminating the complexity of coating the disk face for both $\lambda_P$ and $\lambda_L$ that can be problematic for traditional face pumping.

According to some embodiments, the pump laser may include high-power fiber-coupled pump diodes, a diode driver, and a heat sink. The pump diodes may be integrated with pump optics to shape the beam footprint and beam divergence in order to transmit the pump beam through the entrance facet of the composite gain element. Accordingly, overlap with the laser mode at the active layer may be adjusted by adjusting the pump beam footprint and beam divergence using the pump optics. The pump optics are also used to efficiently reflect off of back facets 204 in gain element 200, namely facets 204-1, 204-2, and 204-3. Having pump beams 220 reflecting off of facets 204 enables four absorption passes of each pump beam 220 within doped region 215.

In some embodiments the polarization of pump beams 220 is adjusted to obtain a desired absorption within doped region 215. In such configuration, when pump beam 220 is polarized along the plane of incidence the absorption of pump beam 220 in doped region 215 may be maximized. Such configuration may be desirable to obtain population inversion for the Yb ions in doped region 215 and lasing at $\lambda_L$, with a lower pump power. More generally, in some embodiments pump beam 220 is polarized along the plane of incidence regardless of whether the pump beam propagates at a Brewster's angle relative to the normal to bottom surface 202. In such embodiments the absorption of pump beam 220 in doped region 215 may be maximized relative to other polarization configurations of pump beam 220.

For power scaling, some embodiments may use gain element 200 (cf. FIGS. 2A-2B) cascaded in a multi-element resonator. Some embodiments use an air-gap zig-zag design as shown in FIG. 3, described in detail below.

Figure 3:
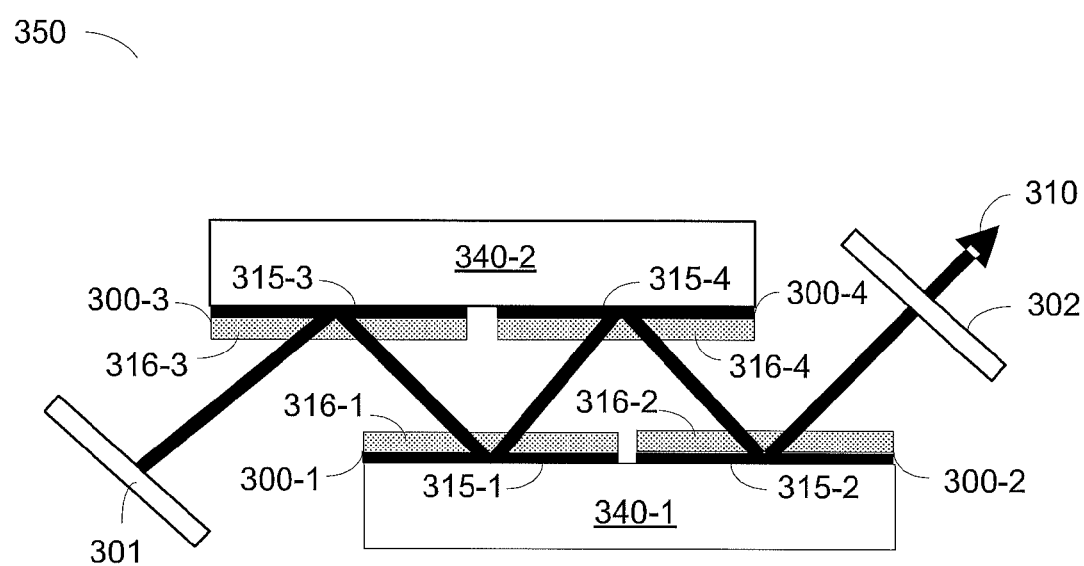
FIG. 3 illustrates a zigzag air gap resonator constructed from quasi-face pumped Yb:MDT/MDT composites and orientation of pump facets in sequential gain elements, according to some embodiments.

FIG. 3 illustrates zig-zag airgap resonator 350 constructed from quasi-face pumped Yb:MDT/MDT gain elements 300-1, 300-2, 300-3, and 300-4 (collectively referred to as gain elements 300) having pump facets orientated in a sequential gain configuration. Resonator 350 may include any number of gain elements 300. Although FIG. 3 illustrates four gain elements 300-1, 300-2, 300-3 and 300-4; one of ordinary skill would recognize that the number of gain elements used in resonator 350 is not limiting. According to some embodiments, gain elements 300 may be as gain element 200 described in detail above with respect to FIGS. 2A and 2B. Thus, gain elements 300 may include doped crystal regions 315, and undoped crystal regions 316 adjacent to one another. In some embodiments gain elements 300 may be coupled to cooling blocks 340 in order to reduce thermal effects. For example, gain elements 300-1 and 300-2 may be coupled to cooling block 340-1, and gain elements 300-3 and 300-4 may be coupled to cooling block 340-2. Cooling blocks 340-1 and 340-2, collectively referred to as cooling blocks 340, may include a material having a large thermal conductivity coupled to a heat sink, so that heat flows easily from gain element 300 to the heat sink. Note that according to some embodiments cooling block 340 is placed in contact with doped region 315 in gain element 300. This is because doped region 315 performs most of the absorption of the pump laser, and is therefore the region where quantum defect heating and subsequent thermo-optic effects are concentrated. The very thin doped region 315 of gain element 300 may be in direct contact with cooling block 340 for efficient longitudinal cooling of any residual thermal loading.

Thermal management considerations are significant in the design of high average power lasers according to some embodiments. Also, in some embodiments the laser gain medium satisfies material properties, to operate in a practical laser system. For example, the laser gain medium may have high absorption and emission cross sections at specific wavelengths, a low lasing threshold, and high slope efficiency. Some embodiments use as a laser gain medium a material selected from the monoclinic double tungstate (MDT) family of crystals. Some of these materials may include KGd(WO$_4$)$_2$, KY(WO$_4$)$_2$, and KLu(WO$_4$)$_2$ (KGW, KYW and KLW respectively). The MDT family of crystals includes effective laser host crystals, particularly well suited for construction of high power lasers when doped with Yb ions.

Resonator 350 includes HR mirror 301, and output coupler 302 for laser radiation 310. According to some embodiments, HR mirror 301 is coated such as to produce maximum reflectivity at laser wavelength $\lambda_L$. Further according to some embodiments, output coupler 302 may include a coating layer for partial reflectivity at laser wavelength $\lambda_L$. Thus, output coupler 302 may be partially reflective and partially transmissive at the laser wavelength $\lambda_L$, according to some embodiments.

Each gain element 300 can be rotated relative to one another to further homogenize the overall pump profile. In some embodiments, gain elements 300 may be placed external to the laser cavity in a master oscillator power amplifier (MOPA) configuration. Further according to some embodiments, gain element 300 may be increased in transverse dimension. Thus, a greater average output power may be obtained using the same pump intensity on the facets of the composite gain element.

Figure 4:
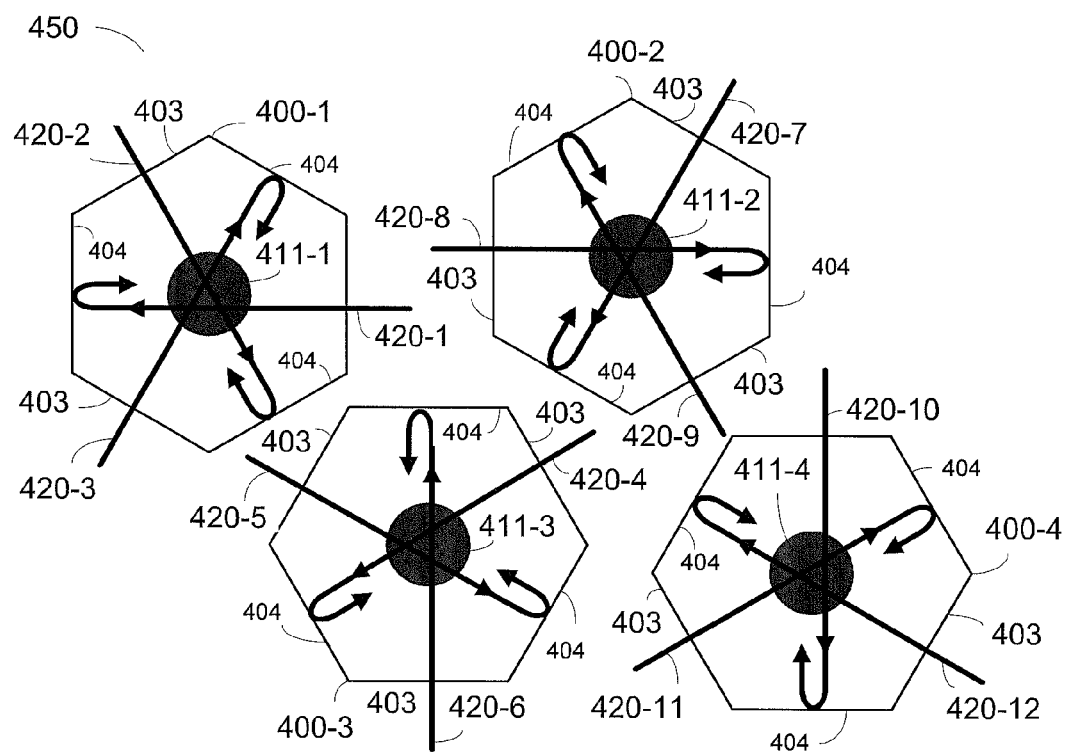
FIG. 4 illustrates an array of multiple emitters constructed from quasi-face pumped Yb:MDT/MDT gain elements with pump facets oriented for increased output power, according to some embodiments.

FIG. 4 illustrates an array 450 of multiple emitters constructed from quasi-face pumped Yb:MDT/MDT gain elements 400-1, 400-2, 400-3, 400-4 (collectively referred to as gain elements 400) with pump facets 403 oriented for increased output power, according to some embodiments. Although FIG. 4 illustrates gain elements 400-1, 400-2, 400-3, and 400-4, one of ordinary skill will recognize that the specific number of gain elements 400 used in array 450 is not limiting. Gain elements 400 may be composite crystal elements having a doped region adjacent to an undoped region, similar to gain elements 200 and 300 (cf. FIGS. 2A-2B, and 3).

Gain elements 400 include pump facets 403 and back facets 404, similar to pump facet 203 and back facet 204 in gain element 200 (cf. FIG. 2A). Thus, in some embodiments pump facets 403 may have an AR coating at $\lambda_P$, and back facets 404 may have a HR coating at $\lambda_P$.

According to some embodiments, the arrangement of gain elements 400-1, 400-2, 400-3, and 400-4 may be such that the pump laser beam is used more effectively. For example, for gain elements 400-1 and 400-2 pump facets 403 may be oriented along a similar direction in the plane including emitting portions 411. Likewise, for gain elements 400-3 and 400-4 pump facets 403 may be oriented along a similar direction in the plane including emitting portions 411. Emitting portions 411 may be as emitting portion 211 described in detail above in relation to emitting portion 211 (cf. FIG. 2B). Pump beams 420-1, 420-2, 420-3, 420-4, 420-5, 420-6, 420-7, 420-8, 420-9, 420-10, and 420-11 (collectively referred to as pump beams 420), may be as pump beam 220 described in detail above in relation to pump beam 220 (cf. FIG. 2A).

Figure 5:
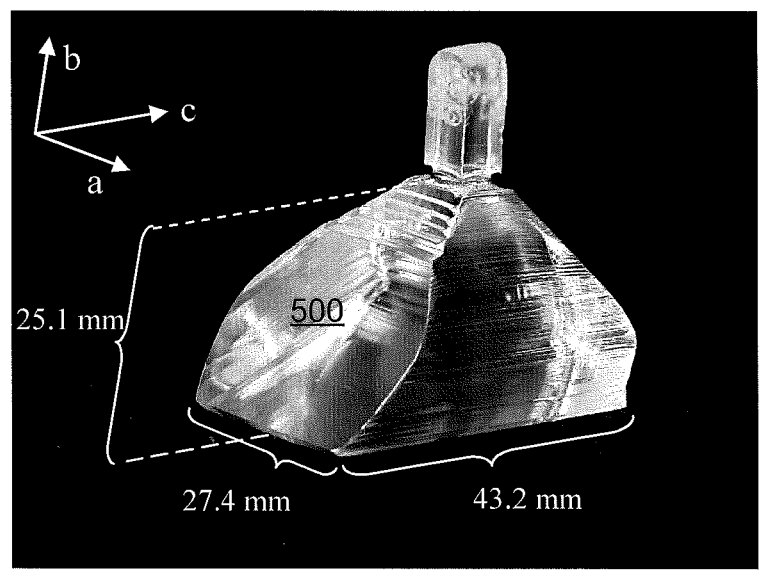
FIG. 5 is a picture of a boule of 20% Yb:KLW grown on an undoped seed, according to some embodiments.

FIG. 5 is a picture of a boule 500 of 20% Yb:KLW grown on an undoped seed. Boule 500 resulted in flawless undoped and Yb-doped KLW crystals of weight of 127.5 grams and dimensions as shown in FIG. 5. Boule 500 demonstrates that MDT crystals with Yb doping concentrations as high as 20% are feasible using fabricating methods and procedures as disclosed herein.

According to some embodiments, a method for fabricating crystal gain medium may include any of MDT crystals such as KGW, KYW, and KLW. Embodiments of a method of fabricating a laser gain medium as disclosed herein include composite construction techniques combining diffusion bonding and epitaxial growth. Some embodiments include doping a crystal such as any of the MDT family of crystals above with Holmium (Ho) and/or Thulium (Tm) for operation at laser wavelength, $\lambda_L=2$ μm. These techniques allow larger gain elements to be constructed, as desired.

Favorable properties of Yb-doped MDT crystals include a large gain bandwidth compared to that of Yb:YAG and high emission cross sections compared with other ytterbium-doped gain media (crystals or glasses) with similarly high gain bandwidth. Also, Yb-doped MDT crystals have a thermal conductivity in the order of 3 to 4 W/(K m), which simplifies cooling of these materials.

Yb-doped MDT crystals according to some embodiments have a small quantum defect. Yb-doped tungstates allow for particularly small values of quantum defect. For example, a 1030 nm Yb:YAG laser would normally be pumped at around 940 nm, the quantum defect is then ~9.57%. In some embodiments, an MDT crystal as disclosed herein may be efficiently pumped at around 981 nm for a laser wavelength $\lambda_L$ shorter than 1030 nm. Some embodiments of a doped MDT crystal may operate with a quantum defect well below 1%. For Yb-doped MDT crystals, a high doping concentration may be achieved without significant quenching, because the replaced ions have very similar ionic radius and the distance between adjacent rare earth lattice sites is relatively large. Furthermore, the natural birefringence resulting from monoclinic crystal structure mitigates thermally induced polarization rotation and depolarization loss.

According to some embodiments, KGW, a member of the MDT crystal family, may be used for gain elements in a laser as disclosed herein. KGW may be used in embodiments with reduced thermal loading. For example, KGW may be used in embodiments having low quantum defect. In embodiments using KGW crystals, the large difference in the ionic radii of Yb (0.858 Angstrom) and Gd (0.938 Angstrom) prevents high doping concentrations due to the accumulation of strain, which may lead to crystal defects. In some embodiments, it is desirable to use crystals and doping ions having a reduced lattice mismatch between doped and undoped crystals, reducing strain. In such embodiments, the fabrication of highly doped composite structures is possible leading to lower strain at the interfaces and preventing fracture in high power applications.

Some embodiments may use a KYW crystal as the medium for doping with rare-earth ions, such as Yb. The ionic radius of Yb is close to that of Y (0.893 Å). Bonded and epitaxially grown Yb doped layers have been demonstrated with KYW in the paper by S. Rivier, et-al., entitled "Diffusion Bonding of Monoclinic Yb:KY(WO$_4$)$_2$/KY(WO$_4$)$_2$ and its Continuous-Wave Laser Operation" OSA/ASSP (2008); and also in the paper by Aznar, et-al. entitled "Growth, optical characterization, and laser operation of epitaxial Yb:KY(WO4)2/KY(WO4)2 composites with monoclinic structure," Applied Physics Letters 85, no. 19, 4315 (2004). Embodiments consistent with the present disclosure use KYW crystals with a doping region having less than approximately 20% Yb concentration. Thus stress is limited in the crystal, preventing appearance of cracks at the interface between the doped region and the undoped region in the gain element.

Some embodiments may use a KLW crystal as the medium for doping with rare earth ions, such as Yb. KLW is isomorphic to KGW and KYW in the MDT crystal family. Yb:KLW is very similar to Yb:KGW and Yb:KYW with respect to optical, mechanical, and thermal properties. The optical, mechanical and thermal properties of Yb:KLW crystals has been studied in detail in the thesis by Mateos Ferré, entitled Crystal growth, optical characterisation and laser operation of Yb$^{3+}$ in monoclinic double tungstates, dissertation, 2004, Física i Cristal•lografia de Materials (FiCMA), Departament de Química Física i Inorgànica, Universitat Rovira i Virgili, Campus Sescelades, Av. Països Catalans, n° 26, 43007 Tarragona, Spain.

KLW has the additional benefit that the ionic radius for Yb (0.858 Angstrom) is much closer to that of Lu (0.850 Angstrom) than either Gd or Y. As a result, the lattice mismatch between KLW and KYbW is half that of KYW and KYbW. Good quality epitaxial thin layers have been produced with up to 50% Yb doped layers on undoped KLW substrates using liquid phase epitaxy. Thus, quasi-cw and mode-locked lasing has been demonstrated by Aznar, et al. in the paper entitled "Liquid-Phase Epitaxy Crystal Growth of Monoclinic $KLu_{1-x}Yb_x(WO_4)_2/KLu(WO_4)_2$ Layers," Crystal Growth & Design 6, no. 8, 1781 (2006).

In some embodiments, composite gain elements having doped regions adjacent to undoped regions may be prepared via epitaxial growth. In some embodiments, composite gain elements having doped regions adjacent to undoped regions may be prepared via bonding. Choosing between a bonding technique and an epitaxial growth technique to form the composite gain element may depend on the specific laser design sought. Bonding allows for construction of the composite gain elements along any crystallographic direction whereas epitaxial composites are limited to natural growth directions. Epitaxial growth of a doped layer on an undoped substrate has the advantage of producing well aligned lattices of doped and undoped regions. In addition, epitaxial growth can produce very low stress interfaces by smoothly increasing the dopant from undoped to heavily doped, over a short growth period. Thus, some embodiments of a method to fabricate a composite gain element include epitaxial growth eliminating a stepwise change in the lattice parameter. This smoothly varying composition also eliminates any residual step-wise changes in refractive index that could lead to small internal reflections that are troublesome in very high power systems.

Embodiments using KLW as the crystal medium may be used in high average power laser applications, due to the ability to reach high doping levels with very low lattice mismatch with the undoped region of the composite gain element. As such, very low stress composite gain elements can be constructed with very thin doped regions from which heat can be efficiently extracted. Embodiments using KLW as the crystal medium also result in low strain composite doped/undoped thin disk structures.

Some embodiments use a composite Yb:KLW gain element combined with an RBL lasing configuration. These embodiments may scale to very high power laser applications, having additional advantages such as a gain element that is simple to manufacture. Some embodiments may include a quasi-face pumped configuration (cf. FIG. 2A) providing uniform pump distribution across the laser mode volume. Such embodiments yield efficient optical conversion with superior output beam quality. The small quantum defect of Yb:KLW combined with the composite thin disk configuration allows for minimal thermal loading and effective thermal management. Some embodiments improve thermal management using anti-Stokes fluorescence cooling in addition to RBL.

Some embodiments of laser designs and systems may be used for characterizing gain element performance. Thus, gain element design and anti-Stokes fluorescence cooling may be optimized. Accordingly, some embodiments provide operational advantages allowing identification of relevant system and payload level applications. For example, a system including array 450 (cf. FIG. 4) may be used to characterize the slope efficiency of multiple emitters fabricated according to techniques as disclosed herein. The slope efficiency may include a plot of the total input pump power at wavelength $\lambda_P$ provided to array 450 versus the total laser power obtained at wavelength $\lambda_L$.

In some embodiments, a method for laser modeling is provided. The method may include placing a composite KLW laser medium in a configuration such as array 450 (cf. FIG. 4) or resonator 350 (cf. FIG. 3), and calculating the performance. In some embodiments, a method for laser modeling may include an "off-axis" face pumping step. Thus, in some embodiments a method for laser modeling provides a sensitivity analysis of laser performance as a function of laser input parameters. In some embodiments, a method for laser modeling includes measuring laser performance for a varying thickness of the doped region, and a varying doping concentration. According to some embodiments, the doping concentration is the Yb doping level in the MDT crystal, which controls the absorbed pump power. In some embodiments, a method for laser modeling includes measuring laser performance for a varying laser output coupler reflectivity. For example, in some embodiments the performance of a resonator cavity 350 may be measured for varying reflectivity of output coupler 302 at wavelength $\lambda_L$. Some embodiments of methods for laser modeling as disclosed herein provide specifications for the manufacturing of the composite gain elements. For example, some embodiments may provide the doping level concentration that may be used in the manufacturing of a composite gain element. Some embodiments of the method for laser modeling may provide a thickness of the doped region.

Some embodiments use KLW and Yb:KLW crystals as the laser gain medium. In some embodiments, the doped crystal region and the undoped crystal region of the laser are prepared by diffusion bonding. Substrates may be approximately 2×15×15 $mm^3$ in size, and may be fine polished prior to diffusion bonding. A diffusion bonding step provides a combined substrate including an undoped crystal region adjacent to a doped crystal region. Substrate compositions include doped regions having different concentrations. Some embodiments may include Yb:KLW crystals having 5%, 10%, 20%, and 100% Yb doping concentration.

Figure 6:
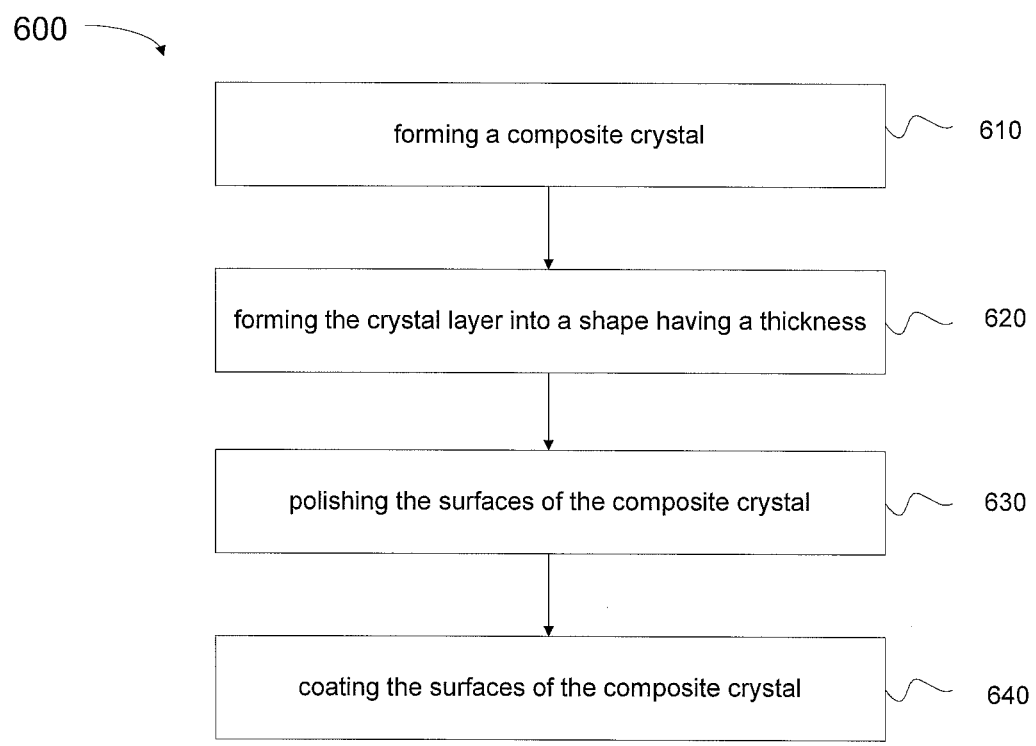
FIG. 6 illustrates a flow chart in a method of manufacturing a laser gain medium according to some embodiments.

FIG. 6 illustrates a flow chart in a method 600 of manufacturing a laser gain medium according to some embodiments. Some embodiments provide method 600 with a gain medium having an undoped region of a crystal adjacent to a doped region of a crystal. Accordingly, a bulk crystal having a square outline may be formed to a composite crystal in step 610. Step 610 may be performed by bonding an undoped region of a crystal with a doped region of a crystal. In some embodiments, step 610 may be performed by epitaxial growth of a doped region of a crystal onto an undoped region of a crystal. In some embodiments, step 610 may be performed by bonding a doped region of a crystal to an undoped region of a crystal. In step 620, the composite crystal is formed into a shape having a thickness. The shape of the composite crystal in step 620 may be a hexagonal design (cf. FIG. 2B). In some embodiments the crystal is provided with angled side facets, and the composite crystal is formed to thickness 234 (cf. FIG. 2A) in step 620. It should be noted that the exact geometry of the shape of the composite crystal is not limiting. One of ordinary skill in the art would recognize that a composite crystal having rectangular, hexagonal, or any other shape may be used, consistent with the present disclosure. For example, the composite crystal may be formed in a shape having an even number of sides, according to some embodiments.

Forming the composite crystal to a desired thickness 234 may include grinding and polishing the crystal in step 630. In some embodiments, thickness 234 may be obtained from a modeling step. In some embodiments a thickness between 100 and 300 μm may be obtained for the doped region in step 630. In step 640 the surfaces of the composite crystal are coated accordingly. For example, a crystal formed into a hexagonal gain element such as element 200 (cf. FIG. 2A) may include top face 201, bottom face 202, and at least one pump facet 203 and one back facet 204. In such embodiments, step 640 may include coating bottom face 202 with a HR coating at $\lambda_P$. Furthermore, some embodiments may include coating top face 201 with an AR coating at $\lambda_L$. Step 640 may also include coating pump facet 203 with an AR coating at $\lambda_P$, and coating back facet 204 with an HR coating at $\lambda_P$.

Following fabrication and polishing of the composite crystal substrate, the method includes coating the gain element facets with an optical coating. In some embodiments, the bottom face of the crystal composite is coated with a high reflectivity coating at $\lambda_P$. The top face of the crystal composite may be coated with an AR coating at $\lambda_P$. In some embodiments the coating step includes adding an AR coating at $\lambda_P$ to the pump facets.

Figure 7:
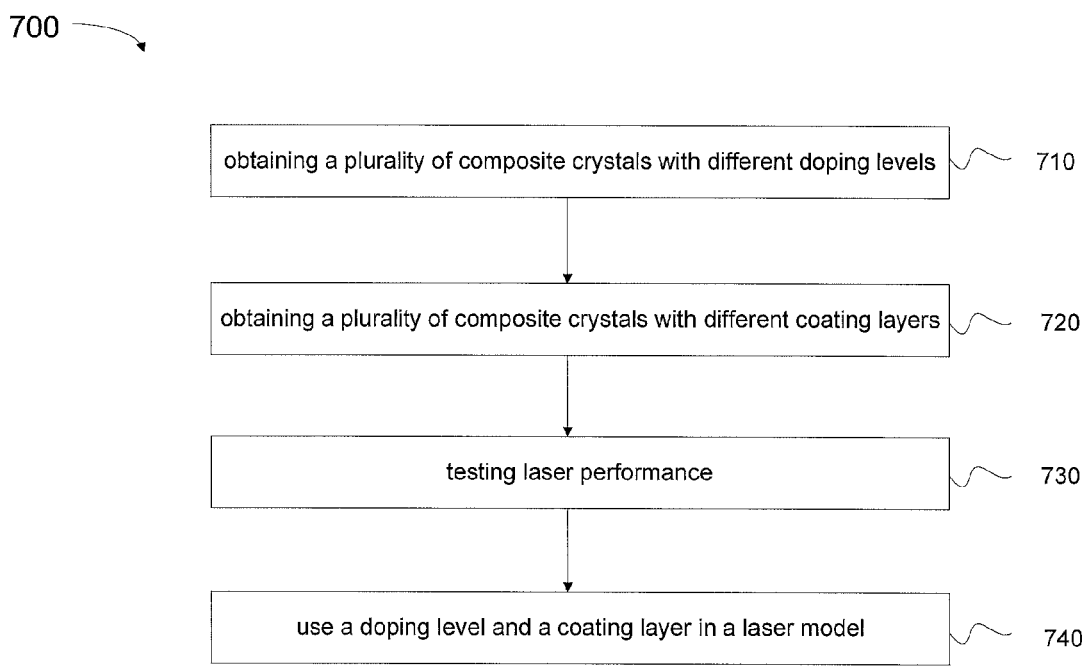
FIG. 7 illustrates a flow chart in a method for testing a laser according to some embodiments.

FIG. 7 illustrates a flow chart in a method 700 for testing a laser according to some embodiments. Method 700 includes step 710 for obtaining a plurality of composite crystals having an undoped region adjacent to a doped region, where the doping level of the doped region is varied for each composite crystal. Method 700 may also include coating each composite crystal with a different coating layer in step 720. Method 700 also includes testing laser performance in step 730 for each of the plurality of composite crystals provided in the previous steps. Step 730 may include a measurement of the laser output power as a function of pump power. In some embodiments the pump power may be parameterized by a set of different output coupler reflectivities. For example, some embodiments of method 700 may include a resonator such as resonator 350, and an output coupler reflectivity may be the reflectivity of output coupler 302. Testing the laser action may also include characterizing the laser beam quality. The laser results may be used for the laser modeling method, in step 740. Step 740 may include using a selected doping level and a selected coating layer on each surface in a composite gain element in a laser model as described above. The laser model may include a resonance cavity including a plurality of composite gain elements, such as resonance cavity 350 (cf. FIG. 3). The laser model in step 740 may also include a plurality of laser gain elements in an array such as array 450 (cf. FIG. 4). With a laser testing method 700 and a laser modeling method as above, some embodiments of a laser design may scale laser power up to a kW-class.

According to some embodiments, Yb:KLW layers may be epitaxially grown on undoped KLW to form composite gain elements. Modeling and testing of epitaxially grown composites may be performed similarly to testing of diffusion bonded elements. Hence, similar pumping schemes may be used for testing epitaxially grown composite gain elements and bonded composite gain elements. Laser performance may be characterized by measuring the output power as a function of pump power parameterized by different output coupler reflectivities as above. Laser performance may also include characterizing the beam quality.

A method for optimizing the gain element design may include a composite crystal construction including diffusion bonding and epitaxial growth. The gain element design may also be optimized in its physical dimensions, the number of pump facets, thickness of doped and undoped layers, and the dopant concentration. Improved manufacturability reduces gain element cost. A scalable design enables much higher power lasing. Some embodiments achieve further power scaling by cascaded intra-cavity gain elements and/or external cavity power amplifiers. Thus, embodiments as disclosed herein take advantage of anti-Stokes fluorescence cooling to approach full RBL.

In addition to the 1 µm high power applications addressed in this disclosure, some embodiments use doping of the MDT family of crystals for 2 µm lasing. This allows for potential high power 2 µm sources, using Ho and/or Tm ions as dopant.

Embodiments described in this disclosure are exemplary only and are not intended to be limiting. One skilled in the art will recognize variations of the described embodiments, each of which should be considered to be within the scope of this disclosure. As such, this application is limited only by the claims.

We claim:

1. A laser gain element, comprising:
   an undoped layer of a monoclinic double tungstate (MDT) crystal;
   a layer of doped MDT crystal adjacent to the undoped layer, the doped MDT layer including a pre-selected concentration of rare earth ions; wherein
   the layer of doped MDT crystal has an absorption peak at a first wavelength and an emission peak at a second wavelength longer than the first wavelength; and
   the layer of doped MDT crystal has a fluorescence emission with a weighted average at a third wavelength shorter than the first wavelength,
   first facets formed on side edges of the layer of undoped MDT crystal, the first facets accepting normal incident pump light such that the pump light is reflected from a surface of the doped MDT crystal adjacent to the layer of undoped MDT crystal,
   a second facet formed on the side edges opposite each of the first facets of the layer of undoped MDT crystal such that light reflected from the surface of the doped MDT crystal that is received by a corresponding first facet is reflected by the second facet back to the first facet,
   wherein there are at least three first facets.

2. The laser gain element of claim 1 formed in a shape having an even number of sides, wherein the number of sides is six or greater.

3. The laser gain element of claim 1 wherein the incident pump light enters the undoped layer and impinges on the doped layer at a grazing angle of incidence.

4. The laser gain element of claim 1 wherein each side of the laser gain element has a first facet or a second facet formed in the undoped layer of MDT crystal; and further comprising:
   an AR coating on each of the first facets for a pump wavelength; and
   an HR coating on each of the second facets for the pump wavelength.

5. The laser gain element of claim 1 further comprising a top surface and a bottom surface, the top surface having an AR coating for the laser wavelength; and
   the bottom surface having a HR coating for the laser wavelength.

6. The laser gain element of claim 5 wherein the undoped layer comprises the top surface and the doped layer comprises the bottom surface.

7. The laser gain element of claim 6 wherein the top surface and the bottom surface form a total thickness and the thickness of the doped layer is about $1/10^{th}$ or less of the total thickness.

8. The laser gain element of claim 7 configured so that a laser beam exits the laser from the top surface.

* * * * *